US012588422B2

(12) United States Patent
Wang et al.

(10) Patent No.: US 12,588,422 B2
(45) Date of Patent: Mar. 24, 2026

(54) SEMICONDUCTOR DEVICE AND METHOD FOR FABRICATING THE SAME

(71) Applicant: UNITED MICROELECTRONICS CORP., Hsin-Chu City (TW)

(72) Inventors: Hui-Lin Wang, Taipei City (TW); Chen-Yi Weng, New Taipei City (TW); Ching-Hua Hsu, Kaohsiung City (TW); Jing-Yin Jhang, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 576 days.

(21) Appl. No.: 17/972,569

(22) Filed: Oct. 24, 2022

(65) Prior Publication Data

US 2024/0107890 A1 Mar. 28, 2024

(30) Foreign Application Priority Data

Sep. 26, 2022 (CN) .......................... 202211175175.7

(51) Int. Cl.
H10N 50/01 (2023.01)
H10B 61/00 (2023.01)
H10N 50/80 (2023.01)

(52) U.S. Cl.
CPC ............. H10N 50/01 (2023.02); H10B 61/00 (2023.02); H10N 50/80 (2023.02)

(58) Field of Classification Search
CPC ........ H10B 61/00; H10N 50/80; H10N 50/85; H10N 50/10
See application file for complete search history.

(56) References Cited

U.S. PATENT DOCUMENTS

| | | | | |
|---|---|---|---|---|
| 9,472,753 | B1 | 10/2016 | Katine | |
| 2021/0167277 | A1* | 6/2021 | Chern | .................... H10N 50/80 |
| 2022/0069204 | A1* | 3/2022 | Ko | ......................... H10N 50/10 |
| 2022/0302375 | A1* | 9/2022 | Chiu | ...................... H10N 50/01 |

OTHER PUBLICATIONS

Wang, the specification, including the claims, and drawings in the U.S. Appl. No. 17/887,530, filed Aug. 15, 2022.

* cited by examiner

*Primary Examiner* — Shih Tsun A Chou
(74) *Attorney, Agent, or Firm* — Winston Hsu

(57) ABSTRACT

A method for fabricating semiconductor device includes the steps of forming an inter-metal dielectric (IMD) layer on a substrate, forming a metal interconnection in the IMD layer, forming a magnetic tunneling junction (MTJ) on the metal interconnection, and performing a trimming process to shape the MTJ. Preferably, the MTJ includes a first slope and a second slope and the first slope is less than the second slope.

6 Claims, 8 Drawing Sheets

SEMICONDUCTOR DEVICE AND METHOD FOR FABRICATING THE SAME

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of forming an inter-metal dielectric (IMD) layer on a substrate, forming a metal interconnection in the IMD layer, forming a magnetic tunneling junction (MTJ) on the metal interconnection, and performing a trimming process to shape the MTJ. Preferably, the MTJ includes a first slope and a second slope and the first slope is less than the second slope.

According to another aspect of the present invention, a semiconductor device includes an inter-metal dielectric (IMD) layer on a substrate, a metal interconnection in the IMD layer, and a magnetic tunneling junction (MTJ) on the metal interconnection. Preferably, a sidewall of the MTJ includes a first slope and a second slope.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
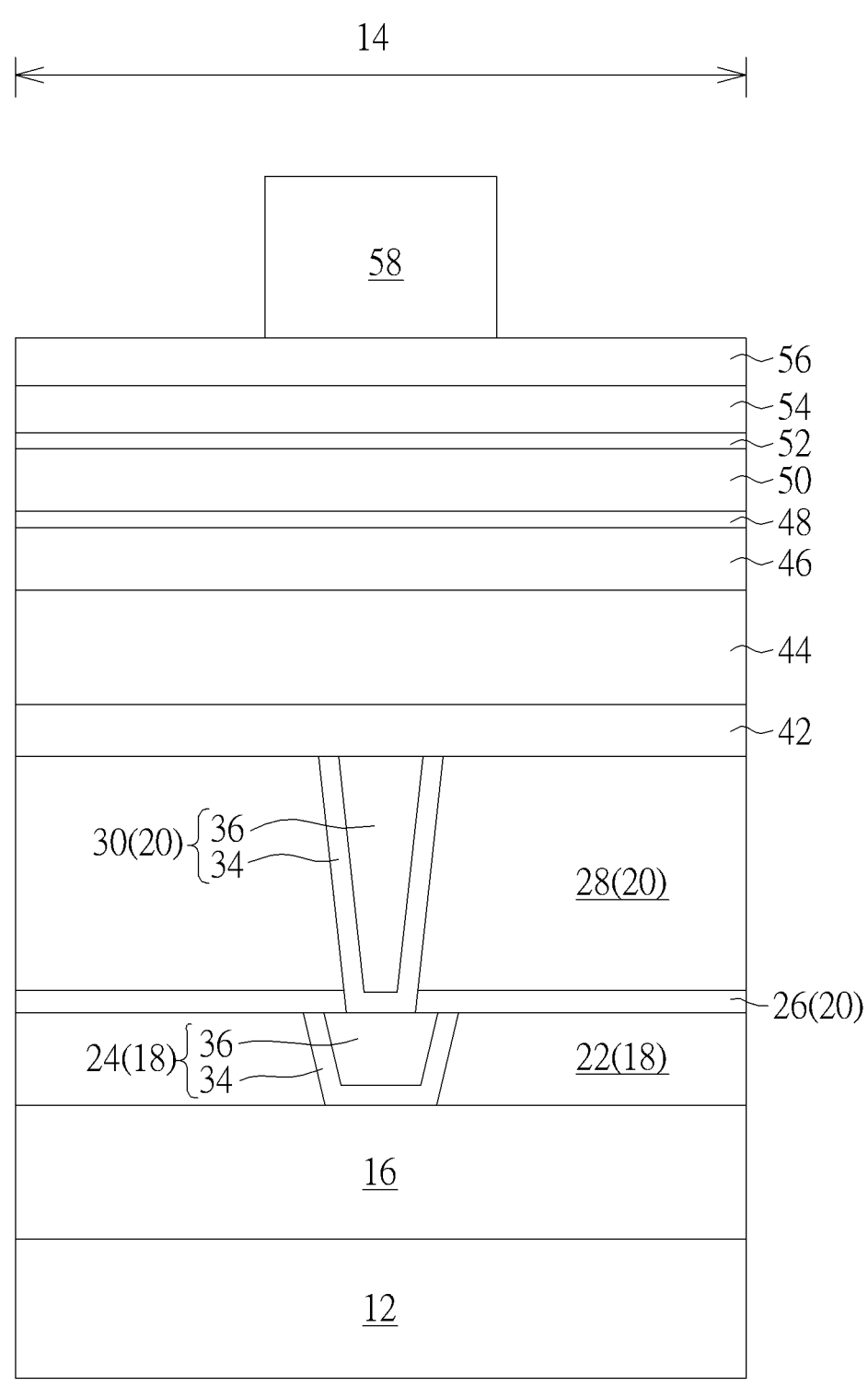
FIGS. 1-8 illustrate a method for fabricating a MRAM device according to an embodiment of the present invention.

Referring to FIGS. 1-8, FIGS. 1-8 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region (not shown) are defined on the substrate 12.

Active devices such as metal-oxide semiconductor (MOS) transistors, passive devices, conductive layers, and interlayer dielectric (ILD) layer 16 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 16 could be formed on the substrate 12 to cover the MOS transistors, and a plurality of contact plugs could be formed in the ILD layer 16 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 18, 20 are sequentially formed on the ILD layer 16 to electrically connect the aforementioned contact plugs, in which the metal interconnect structure 18 includes an inter-metal dielectric (IMD) layer 22 and metal interconnections 24 embedded in the IMD layer 22, and the metal interconnect structure 20 includes a stop layer 26, an IMD layer 28, and metal interconnections 30, 32 embedded in the stop layer 26 and the IMD layer 28.

In this embodiment, each of the metal interconnections 24 from the metal interconnect structure 18 preferably includes a trench conductor and each of the metal interconnections 30, 32 from the metal interconnect structure 20 includes a via conductor. Preferably, each of the metal interconnections 24, 30, 32 from the metal interconnect structures 18, 20 could be embedded within the IMD layers 22, 28 and/or stop layer 26 according to a single damascene process or dual damascene process. For instance, each of the metal interconnections 24, 30, 32 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 in the metal interconnections 24 are preferably made of copper, the metal layers 36 in the metal interconnections 30, 32 are preferably made of tungsten, the IMD layers 22, 28 are preferably made of silicon oxide or ultra low-k (ULK) dielectric layer, and the stop layers 26 is preferably made of nitrogen doped carbide (NDC), silicon nitride, silicon carbon nitride (SiCN), or combination thereof.

Next, a bottom electrode 42, a pinned layer 44, a reference layer 46, a barrier layer 48, a free layer 50, a cap layer 52, a cap layer 54, a top electrode 56, and a patterned hard mask 58 are formed on the metal interconnect structure 20. In this embodiment, the bottom electrode 42 and the top electrode 56 could include conductive material such as but not limited to for example Ta, TaN, Pt, Cu, Au, Al, ruthenium (Ru), or combination thereof, in which the bottom electrode 42 preferably includes TaN while the top electrode 56 includes Ru, but not limited thereto.

The pinned layer 44 could be made of ferromagnetic material including but not limited to for example iron, cobalt, nickel, or alloys thereof such as cobalt-iron-boron (CoFeB) or cobalt-iron (CoFe). Alternatively, the pinned layer 44 could also be made of antiferromagnetic (AFM) material including but not limited to for example ferromanganese (FeMn), platinum manganese (PtMn), iridium manganese (IrMn), nickel oxide (NiO), or combination thereof, in which the pinned layer 44 is formed to fix or limit the direction of magnetic moment of adjacent layers. The reference layer 46 could be made of ferromagnetic material including but not limited to for example iron, cobalt, nickel, or alloys thereof such as cobalt-iron-boron (CoFeB). The barrier layer 48 could be made of insulating material including but not limited to for example oxides such as aluminum oxide ($AlO_x$) or magnesium oxide (MgO).

Preferably, the free layer 50 could be made of ferromagnetic material including but not limited to for example iron, cobalt, nickel, or alloys thereof such as cobalt-iron-boron (CoFeB), in which the magnetized direction of the free layer 50 could be altered freely depending on the influence of outside magnetic field. The cap layer 52 disposed on top of the free layer 50 preferably includes metal oxide such as MgO, the cap layer 54 preferably includes metal such as Ta, the top electrode 56 preferably includes metal such as Ru, and the patterned hard mask 58 preferably includes metal nitride such as TiN.

Figure 2:
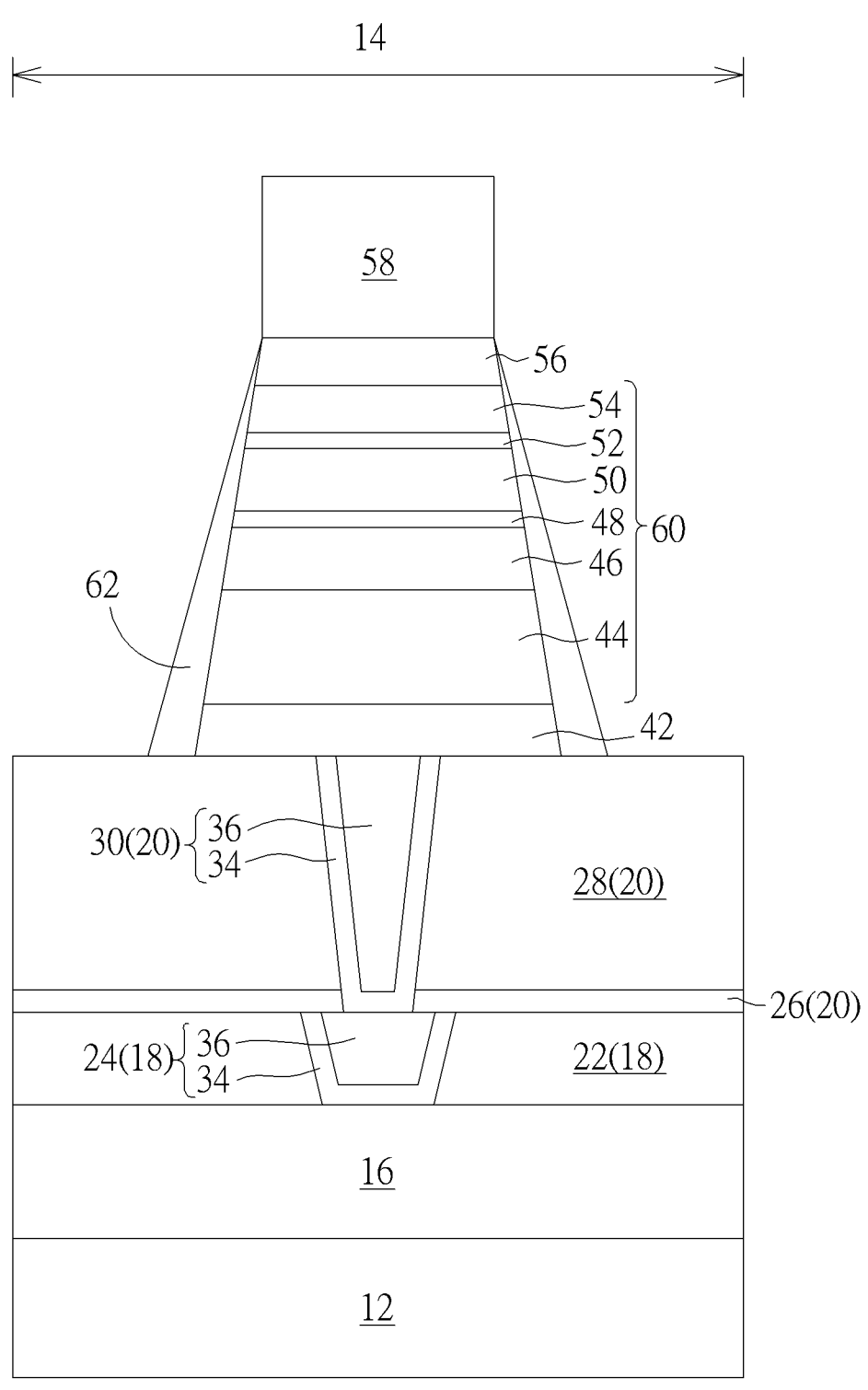

Next, as shown in FIG. 2, an etching process such as an inductively coupled plasma reactive ion etching (ICP-RIE) process is conducted by using the patterned hard mask 58 as mask to remove part of the top electrode 56, part of the cap layer 54, part of the cap layer 52, part of the free layer 50, part of the barrier layer 48, part of the reference layer 46, part of the pinned layer 44, and part of the bottom electrode 42 for forming a MTJ 60 and at the same time forming a metallic byproduct 62 adjacent to the MTJ 60. In this embodiment, the ICP-RIE process conducted at this stage could be accomplished by using a base gas such as CFH or CHOH, but not limited thereto.

Figure 3:
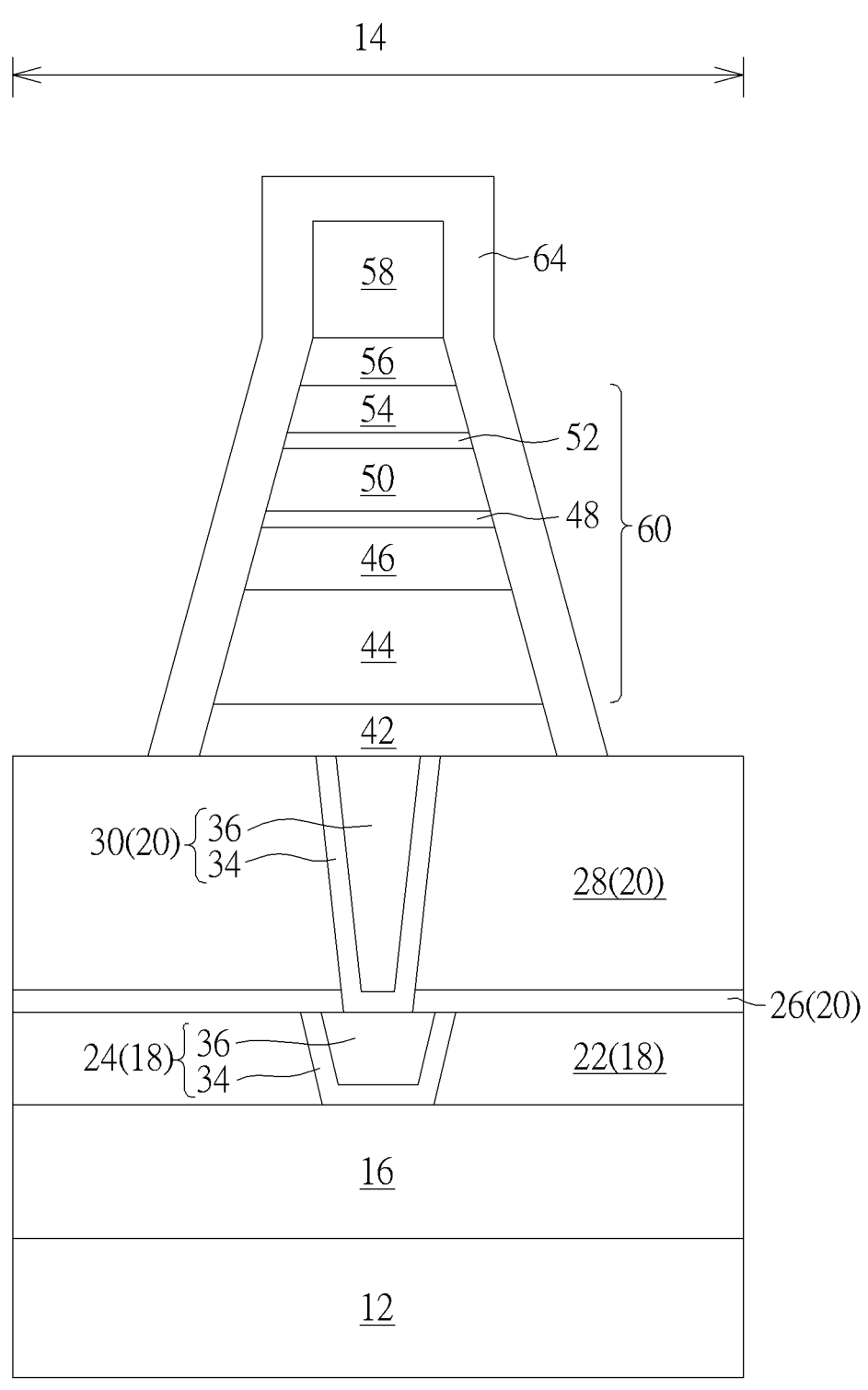

Next, as shown in FIG. 3, step (a) could be carried out by performing an oxidation process to transform the metallic byproduct 62 into an oxidized product 64. It should be noted that the oxidation process conducted at this stage could include an in-situ oxidation process, which could be accomplished by using $N_2O$ to transform the metallic byproduct 62 into an oxidized byproduct 64. Structurally, the thickness of the oxidized byproduct 64 formed at this stage is slightly higher than the thickness of the metallic byproduct 62 formed in FIG. 2 and the oxidized byproduct 64 is disposed not only on sidewalls of the bottom electrode 42, sidewalls of the MTJ 60, and sidewalls of the top electrode 56 but also on the top surface and sidewalls of the hard mask 58.

Figure 4:
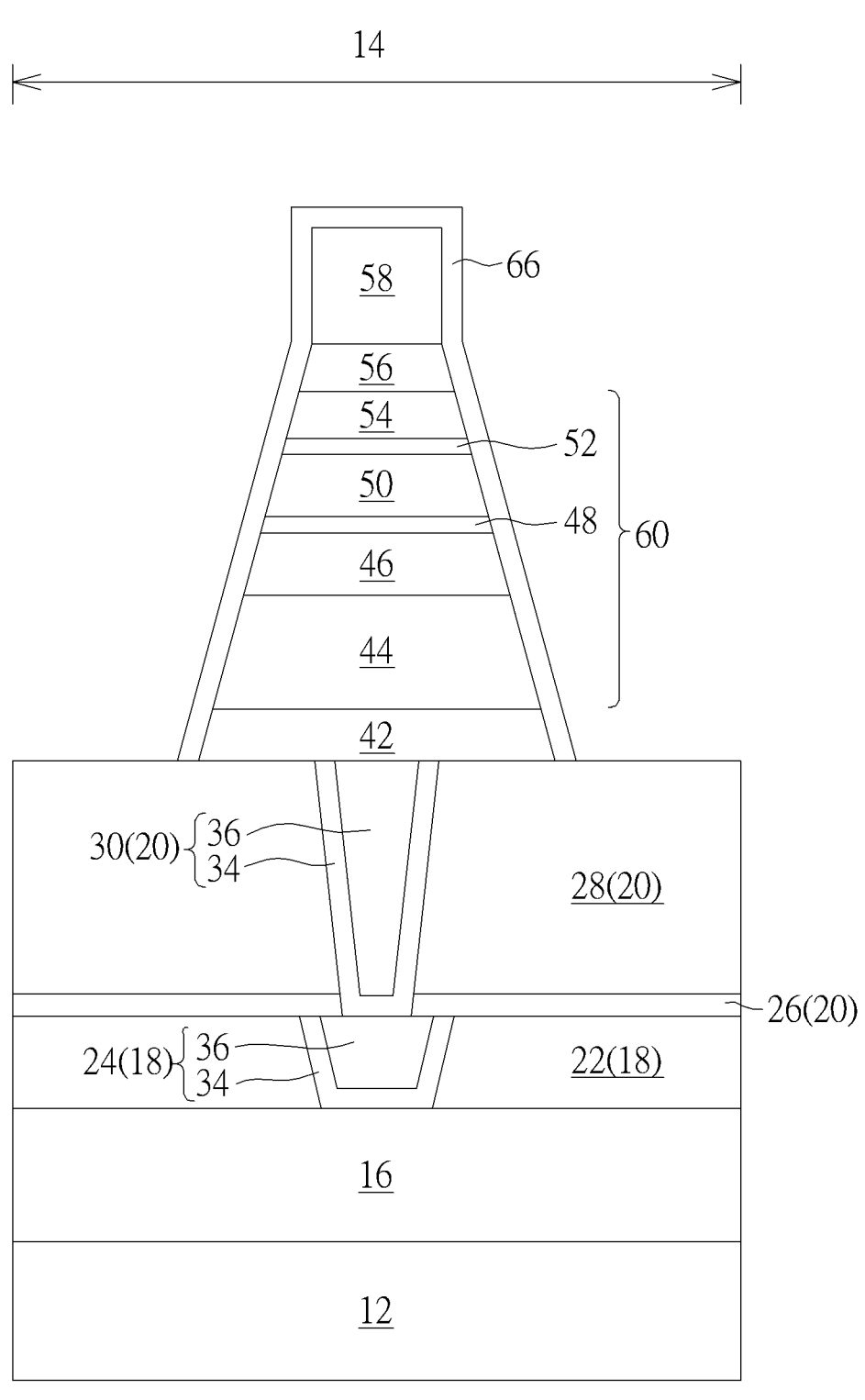

Next, as shown in FIG. 4, step (b) is conducted by performing an etching process to transform the oxidized product 64 into a damaged layer 66. Specifically, the etching process conducted at this stage includes an ICP-RIE process, which preferably uses a base gas content such as hydrogen gas ($H_2$) to transform the oxidized byproduct 64 into a damaged layer 66 including hydrogen atoms. Structurally, the thickness of the damaged layer 66 could be slightly lower than the thickness of the oxidized byproduct 64 formed in the previous stage.

Figure 5:
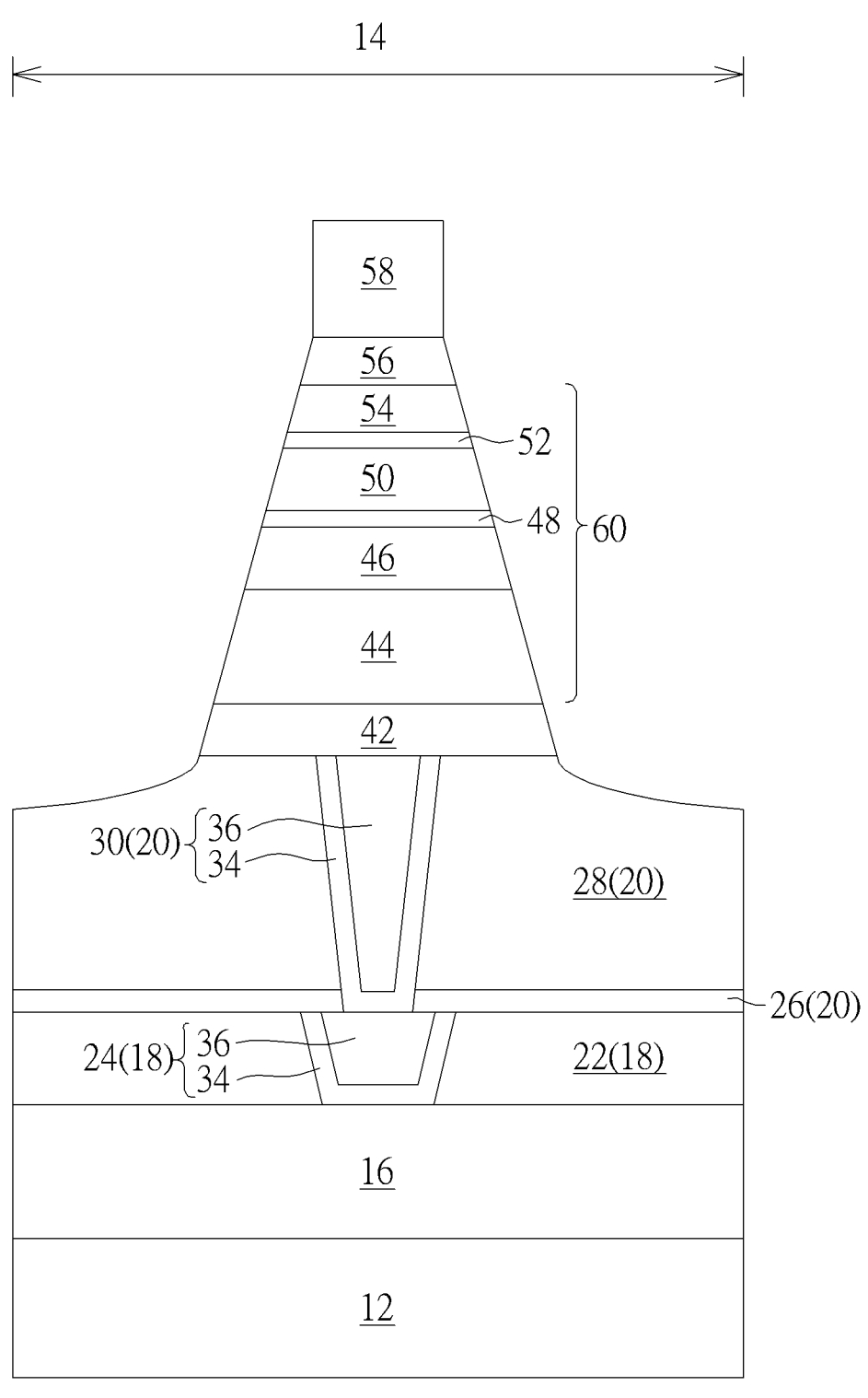

Next, as shown in FIG. 5, step (c) is conducted by performing an etching process to remove the damaged layer 66. Specifically, the etching process conducted at this stage includes an ICP-RIE process, which preferably uses a base gas containing argon (Ar) to remove the damaged layer 66 completely. It should be noted that when the ICP-RIE process is conducted to remove the damaged layer 66, part of the IMD 28 adjacent to two sides of the MTJ 66 could also be removed at the same time so that the top surface of the IMD layer 28 becomes slightly lower than the top surface of the metal interconnection 30 and forms a slightly curved surface.

Figure 6:
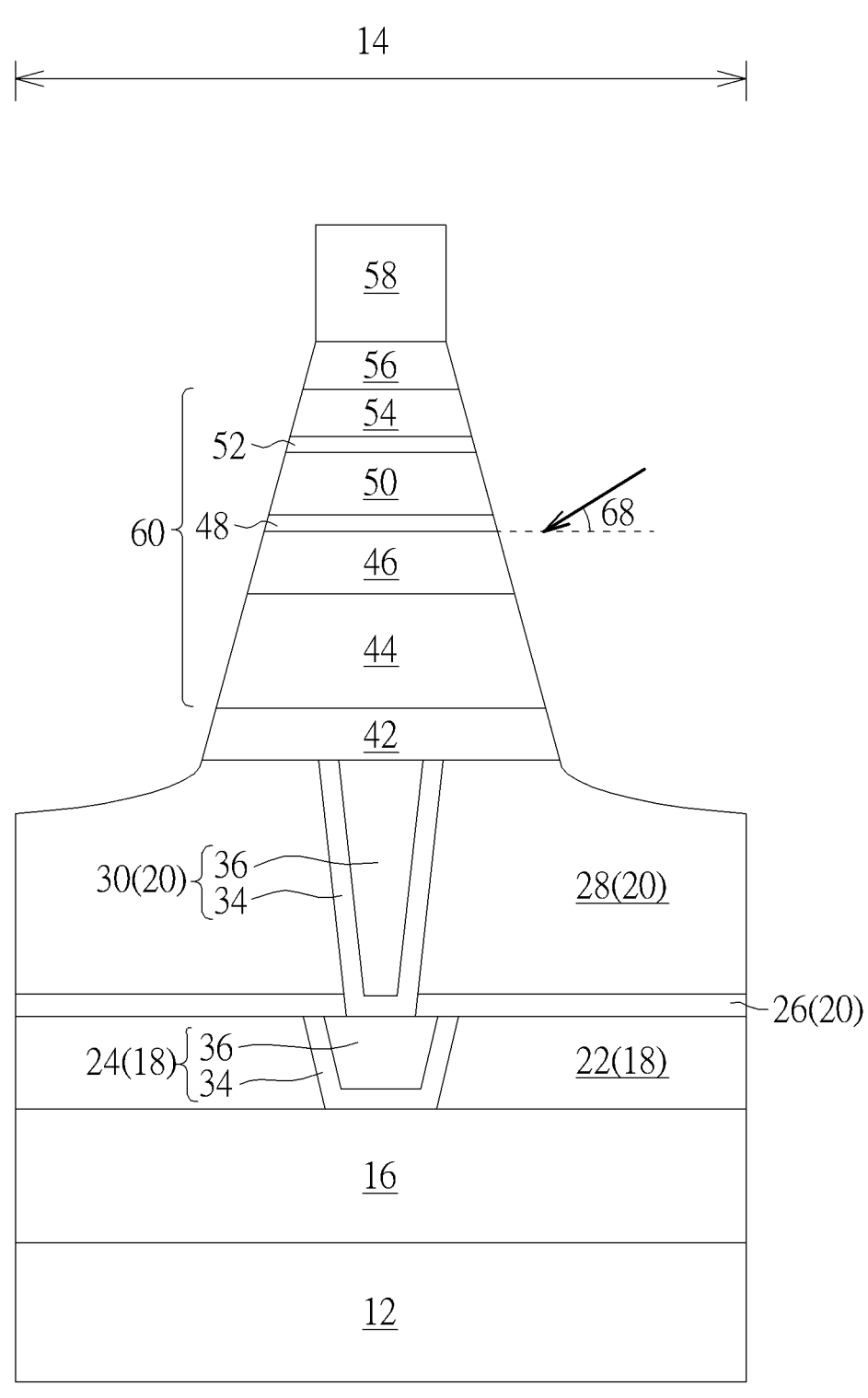

Next, as shown in FIG. 6, step (d) is conducted by performing an etching process to trim the MTJ 60. Preferably, the etching process conducted at this stage includes an ion beam etching (IBE) process and the etching process is accomplished by using low energy at angle 68 to trim the sidewalls of the MTJ 60.

Figure 7:
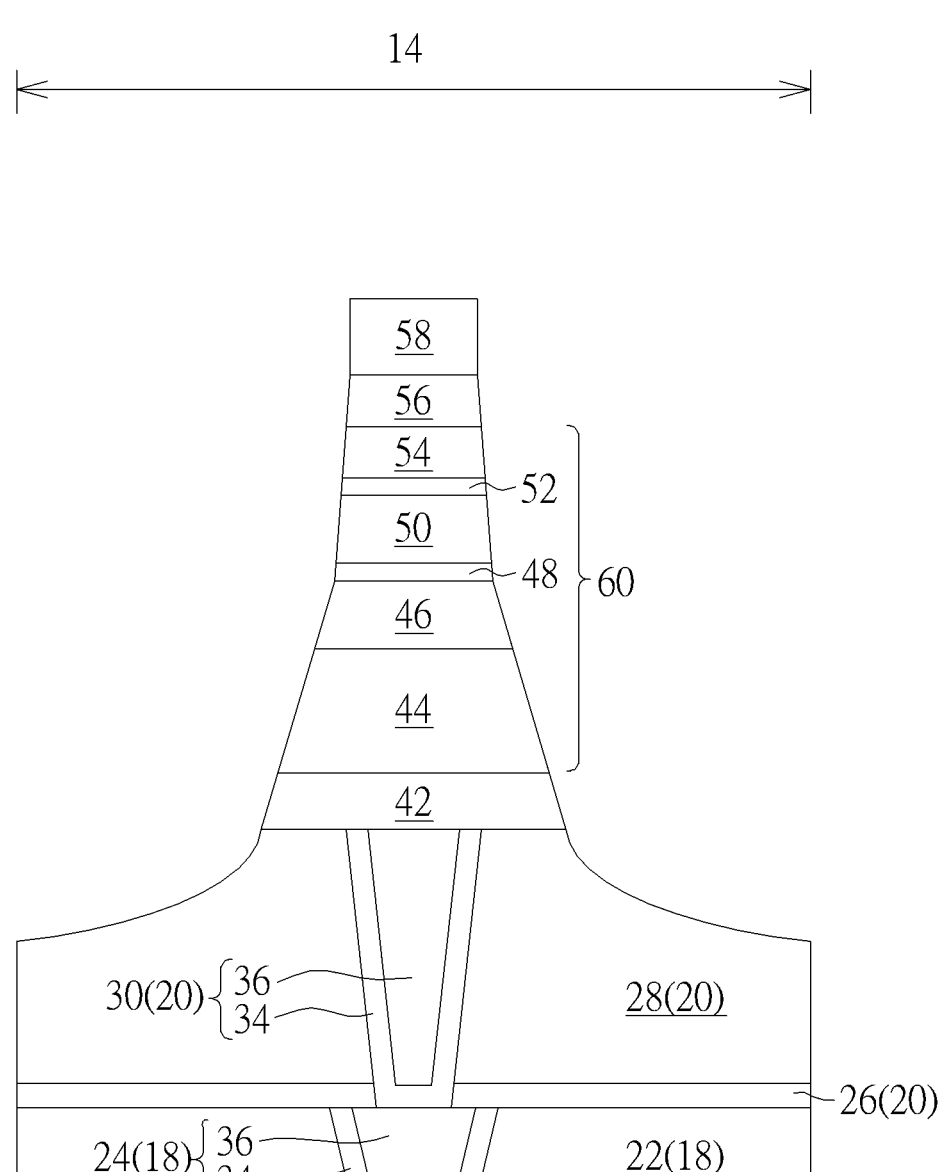

Referring to FIG. 7, FIG. 7 illustrates a structural view of a semiconductor device formed by repeating the aforementioned steps (a) to (d) according to an embodiment of the present invention. As shown in FIG. 7, it would be desirable to repeat the steps (a) to (d) shown in FIGS. 3-6 n times for forming the structure shown in FIG. 7, in which n≥1. Specifically, it would be desirable to first conduct a series of etching processes starting from FIG. 3 by transforming the metallic byproduct 62 tin to an oxide byproduct 64, transforming the oxidized byproduct 64 into a damaged layer 66, removing the damaged layer 66, using low energy with high angle IBE process to trim sidewalls of the MTJ 60, and then repeating these four steps once or more than once such as two times, three times or even four times or more so that the sidewalls of the MTJ 60 are eventually shaped to form different slopes.

Figure 8:
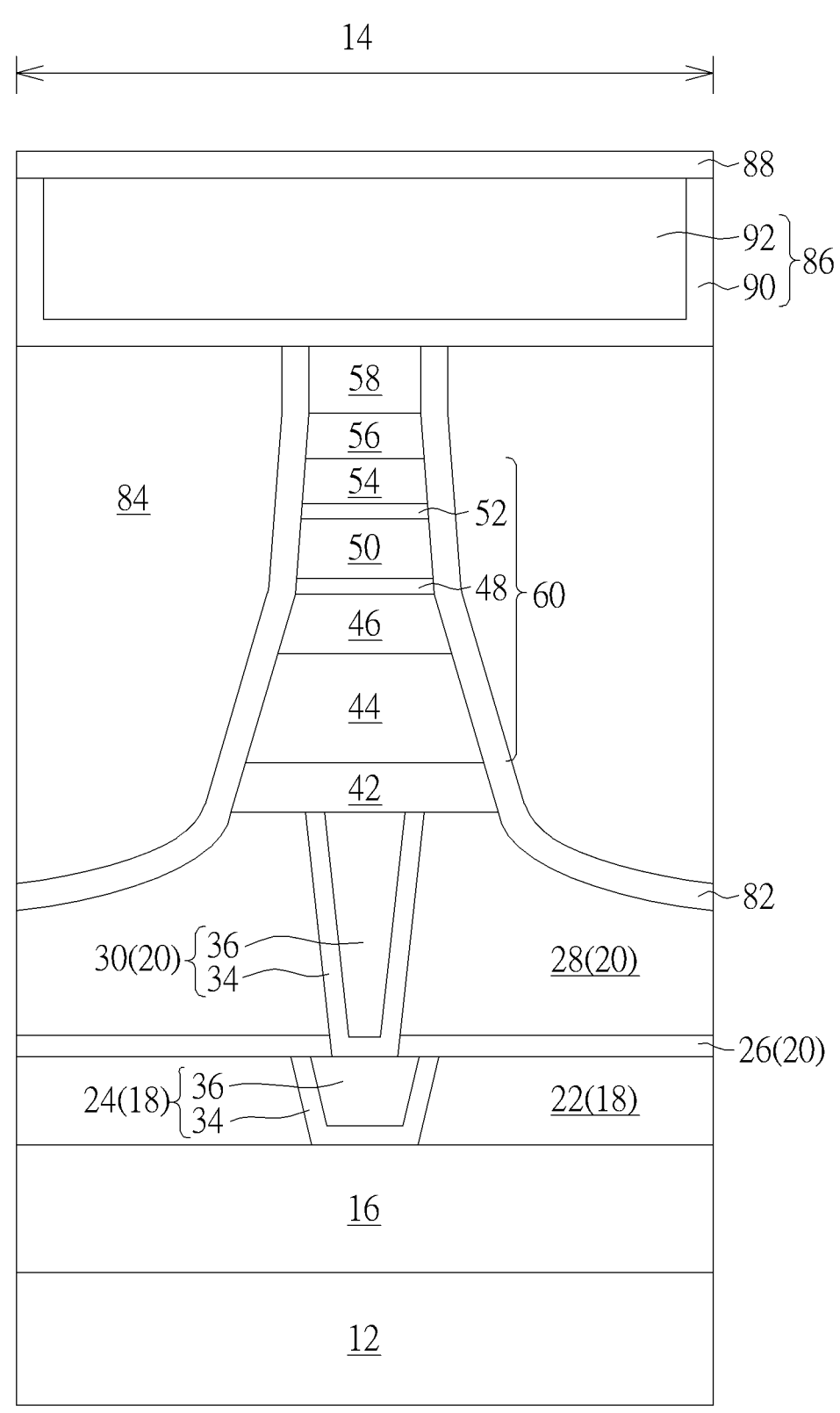

Next, as shown in FIG. 8, a cap layer 82 and an IMD layer 84 are formed on the MTJ 60, and then a planarizing process such as chemical mechanical polishing (CMP) process is conducted to remove part of the IMD layer 84. In this embodiment, the cap layer 82 could include nitrogen doped carbide (NDC), silicon nitride, silicon carbon nitride (SiCN), or combination thereof and the IMD layer 84 preferably includes an ultra low-k (ULK) dielectric layer including but not limited to for example porous material or silicon oxycarbide (SiOC) or carbon doped silicon oxide (SiOCH).

Next, one or more photo-etching process is conducted to remove part of the IMD layer 84 to form a contact hole (not shown), conductive materials are deposited into the contact hole, a planarizing process such as CMP is conducted to form a metal interconnection 86 connecting the hard mask 58 underneath, and another stop layer 88 is formed on the surface of the metal interconnection 86. Similar to the metal interconnections 24 formed previously, the metal interconnection 86 could be formed in the IMD layer 84 through a single damascene or dual damascene process. For instance, the metal interconnection 86 could further include a barrier layer 90 and a metal layer 92, in which the barrier layer 90 could be selected from the group consisting of titanium (Ti), titanium nitride (TiN), tantalum (Ta), and tantalum nitride (TaN) and the metal layer 92 could be selected from the group consisting of tungsten (W), copper (Cu), aluminum (Al), titanium aluminide (TiAl), and cobalt tungsten phosphide (CoWP). Moreover, the metal layer 92 in the metal interconnection 86 preferably includes copper and the stop layer 88 could include nitrogen doped carbide (NDC), silicon nitride, silicon carbon nitride (SiCN), or combination thereof. This completes the fabrication of a semiconductor device according to an embodiment of the present invention.

Referring again to FIG. 8, FIG. 8 further illustrates a structural view of a spin torque transfer (STT) MRAM device according to an embodiment of the present invention. As shown in FIG. 8, the semiconductor device includes a bottom electrode 42 disposed on the substrate 12, a single metal interconnection 30 disposed directly under the bottom electrode 42, a MTJ 60 disposed on the bottom electrode 42 or substrate 12, a top electrode 56 disposed on the MTJ 60, and a hard mask 58 disposed on the top electrode 56. Preferably, the MTJ 60 from bottom to top includes a pinned layer 44, a reference layer 46, a barrier layer 48, a free layer 50, a cap layer 52, and another cap layer 54.

Structurally, the sidewalls of the MTJ 60 after being treated with a series of etching and trimming process as shown in FIGS. 3-6 preferably include at least two different slopes such as a first slope and a second slope, in which the sidewalls of the bottom electrode 42, the pinned layer 44, and the reference layer 46 together include or constitute the first slope while the sidewalls of the barrier layer 48, the free layer 50, the cap layers 52, 54, and the top electrode 56 include or constitute the second slope and the first slope is preferably less than the second slope. It should be noted that even though the second slope seems to be aligned with the hard mask 58 or orthogonal to the surface of the substrate 12, the second slope or sidewalls of the barrier layer 48, the free layer 50, the cap layers 52, 54, and the top electrode 56 are in fact not aligned with sidewalls of the hard mask and also not perpendicular to the substrate 12 surface. In other words, in contrast to the sidewalls of the hard mask 58 being perpendicular to the surface of the substrate 12, the angle included by the sidewalls of the barrier layer 48, the free layer 50, the cap layers 52, 54, and the top electrode 56 and the substrate 12 surface is slightly less than 90 degrees as the two planes are not perpendicular to each other.

Overall, the present invention discloses an approach of using multiple etching processes to pattern a MTJ stack for forming a spin torque transfer (STT) MRAM device, which preferably conducts multiple ICP-RIE processes along with IBE process to pattern a MTJ stack made of pinned layer, reference layer, barrier layer, free layer, and cap layer for forming one or more MTJs. Since the ICP-RIE process has the advantage of having higher plasma density and wider process window compare to conventional RIE process, it would be desirable to obtain better control for the overall MTJ height while patterning the MTJ stack.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   an inter-metal dielectric (IMD) layer on a substrate;
   a metal interconnection in the IMD layer;
   a bottom electrode on the metal interconnection;
   a magnetic tunneling junction (MTJ) on the bottom electrode, wherein a sidewall of the MTJ comprises a first slope and a second slope, the first slope is less than the second slope, and the MTJ comprises:
   a pinned layer on the bottom electrode, wherein the bottom electrode and the pinned layer comprise the first slope.

2. The semiconductor device of claim 1, further comprising:
   the MTJ on the bottom electrode, wherein the MTJ comprises:
   the pinned layer on the bottom electrode;
   a barrier layer on the pinned layer;
   a free layer on the barrier layer;
   a top electrode on the MTJ; and
   a hard mask on the top electrode.

3. The semiconductor device of claim 2, wherein the pinned layer comprises the first slope.

4. The semiconductor device of claim 2, wherein the free layer comprises the second slope.

5. The semiconductor device of claim 2, wherein the top electrode comprises the second slope.

6. The semiconductor device of claim 2, wherein the hard mask and the top electrode comprise different slopes.

* * * * *